United States Patent [19]

Cannella et al.

[11] Patent Number: 4,691,243
[45] Date of Patent: Sep. 1, 1987

[54] CONTACT-TYPE DOCUMENT SCANNER INCLUDING PROTECTIVE COATING

[75] Inventors: Vincent D. Cannella, Birmingham; Zvi Yaniv, Farmington Hills; Robert R. Johnson, Franklin, all of Mich.

[73] Assignee: Energy Conversion Devices, Inc., Troy, Mich.

[21] Appl. No.: 912,476

[22] Filed: Sep. 29, 1986

Related U.S. Application Data

[63] Continuation-in-part of Ser. No. 607,153, May 4, 1984, Pat. No. 4,660,095.

[51] Int. Cl.$^4$ .............................................. H04N 1/024
[52] U.S. Cl. ................................. 358/294; 358/213.12; 358/213.11; 357/30
[58] Field of Search ............... 357/24 CR, 30 H, 30 L, 357/30 G; 358/213.13, 213.29, 213.31, 212, 294; 250/578

[56] References Cited

U.S. PATENT DOCUMENTS

| 3,603,731 | 9/1971 | Weimer | 358/213.29 |
| 3,696,250 | 10/1972 | Weimer | 358/213.22 |
| 4,067,046 | 1/1978 | Nakatani et al. | 357/30 G |
| 4,149,197 | 4/1979 | Kos et al. | 250/578 |
| 4,226,898 | 10/1980 | Ovshinsky et al. | 357/2 |
| 4,390,791 | 6/1983 | Hatanaka et al. | 250/578 |
| 4,482,804 | 11/1984 | Oritsuki et al. | 358/213.11 |
| 4,660,095 | 4/1987 | Cannella et al. | 358/294 |

Primary Examiner—Gene Z. Rubinson
Assistant Examiner—Stephen Brinich
Attorney, Agent, or Firm—Marvin S. Siskind; Richard M. Goldman

[57] ABSTRACT

Image scanning apparatus includes an array of thin film light sensitive elements and relies upon the concept of "proximity focusing" in order to generate electrical signals for replicating an image on an image-bearing member. Included herein is an abrasion-resistant, transparent coating overlying said light sensitive elements.

26 Claims, 8 Drawing Figures

CONTACT-TYPE DOCUMENT SCANNER INCLUDING PROTECTIVE COATING

RELATED APPLICATIONS

This application is a continuation-in-part application of copending U.S. patent application Ser. No. 607,153, now U.S. Pat. No. 4,660,095, filed May 4, 1984.

FIELD OF THE INVENTION

The present invention generally relates to an apparatus adapted to generate electrical signals representative of an image on an image-bearing member. The present invention more particularly relates to an apparatus adapted to generate electrical signals representative of an image on an image-bearing member such as a printed document wherein the image is detectable by sensing light from the high and low optical density portions thereof. In its most specific form, the instant invention relates to a hard, transparent cover layer overlying the light sensitive elements which are operatively disposed to contact the image-bearing surface in a proximity focusing manner, thereby generating said electrical signals.

BACKGROUND OF THE INVENTION

Systems for converting an image, such as characters of a document, into electrical signals which can either be stored in a memory for later recall or which can be transmitted to a remote location over, for example, telephone communication or similar systems, are well known in the reproduction art. Systems of this type have generally been referred to as line scanners. In one type of line scanner, the document is held stationary and a photodetector of an array of photodetectors are scanned across each line of the document along with a localized light source. In another type of scanner, the array of photodetectors and light source are held stationary and the document is moved therepast. In both types of systems, as the document is scanned, the high optical density or dark portions of the document reflect less light from the light source for reception by the photodetectors than the low optical density or light portions. As a result, the high and low optical density portions can be contrasted by the photodetectors for generating electrical signals representative of the image on or other surface characteristic of the document.

While systems of the type described above have been generally successful in fulfilling their intended purposes and have found commercial acceptance, these systems exhibit several deficiencies. The deficiency specifically addressed in the subject patent application deals with the fact that in a contact-type of line scanning system, the array of light sensitive elements is in constant abrasive contact with the image-bearing document. In other situations, a line scanning system, even if not of a contact-type, but which relies upon an array of light sensitive elements, is likely to be employed in an environment wherein acidic, corrosive or other deleterious gases could detrimentally affect the semiconductor alloy material from which those elements are fabricated and hence the performance of the array. By depositing any of the protective coatings described hereinafter immediately atop said elements, the problems associated with such abrasive and corrosive environments have been substantially eliminated.

These and other objects and advantages of the subject invention will become apparent from a perusal of the detailed description of the invention, the drawings and the claims which follow.

SUMMARY OF THE INVENTION

The subject invention provides a new and improved scanner-type apparatus, said apparatus adapted to generate electrical signals representative of small area portions of an image projected onto an associated array of small area light sensitive elements. In accordance with one embodiment, there is provided a contact-type page scanner which is adapted to electronically scan a document or other image-bearing member disposed in close proximity thereto.

The present invention therefore provides an apparatus adapted to generate electrical signals representative of an image on an image-bearing member, which apparatus includes an array of spaced apart, continuous, small area, light sensitive elements formed from deposited, thin film semiconductor material operatively disposed and designed for receiving said image. Each of these small area elements is capable of effecting a detectable electrical characteristic responsive to the intensity of light received thereon from a corresponding small area portion of the image. The array includes at least one column of light sensitive elements operatively disposed so as to cover at least a portion of at least one dimension of the image-bearing member. A transparent cover layer overlies said light sensitive elements, which cover layer forms at least a part of a spacer which is operatively disposed for closely positioning the light sensitive elements in juxtaposed relation relative to said image-bearing member so as to proximity focus light onto said light sensitive elements from corresponding small area portions of said member. The cover layer is formed of an abrasion resistant material selected from the group consisting essentially of a silicon-carbon alloy, a silicon-nitrogen alloy, a silicon-oxygen alloy or a microcrystalline carbon alloy.

The semiconductor alloy material from which the light sensitive elements are fabricated is selected from the group consisting essentially of silicon, germanium or combinations thereof and may further have one or more density of states reducing elements, such as hydrogen or fluorine, added thereto. The light sensitive elements may be operatively utilized as p-i-n photovoltaic diodes or photoresistors.

Preferably, associated with each of the light sensitive elements is an isolation diode or field effect transistor for facilitating the selective addressing and detection or the electrical conductivity of each light sensitive element by the application of read potentials to respective pairs of address lines associated with each of said elements.

Also included as part of the instant invention is apparatus for projecting light onto the image-bearing member, said apparatus operatively disposed on the side of the image-bearing member closest to said cover layer. The light projected onto said member is preferably colored, such as by the sequential projection of red, green and blue light thereonto. The electrical signals provided by each light sensitive element can thereafter be correlated to derive the proper color hue of the small area portion of the image-bearing member adjacent each of the associated light sensitive elements.

Finally, a static shielding layer may be interposed between the light sensitive elements and the transparent cover layer to ensure that any static discharge from the image-bearing document cannot induce a charge in the adjacent array of light sensitive elements.

DESCRIPTION OF THE PREFERRED EMBODIMENTS

Figure 1:
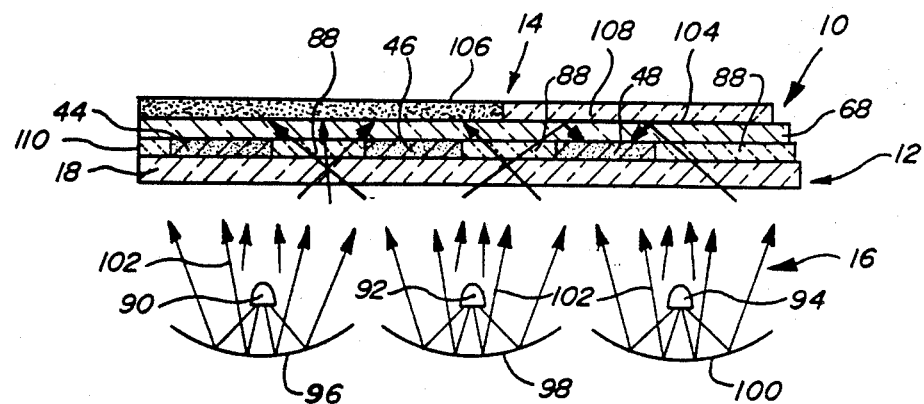
FIG. 1 is partial side view, partly in cross section, of the contact-type document scanner system of the present invention with a document to be scanned disposed over the system.
Figure 2:
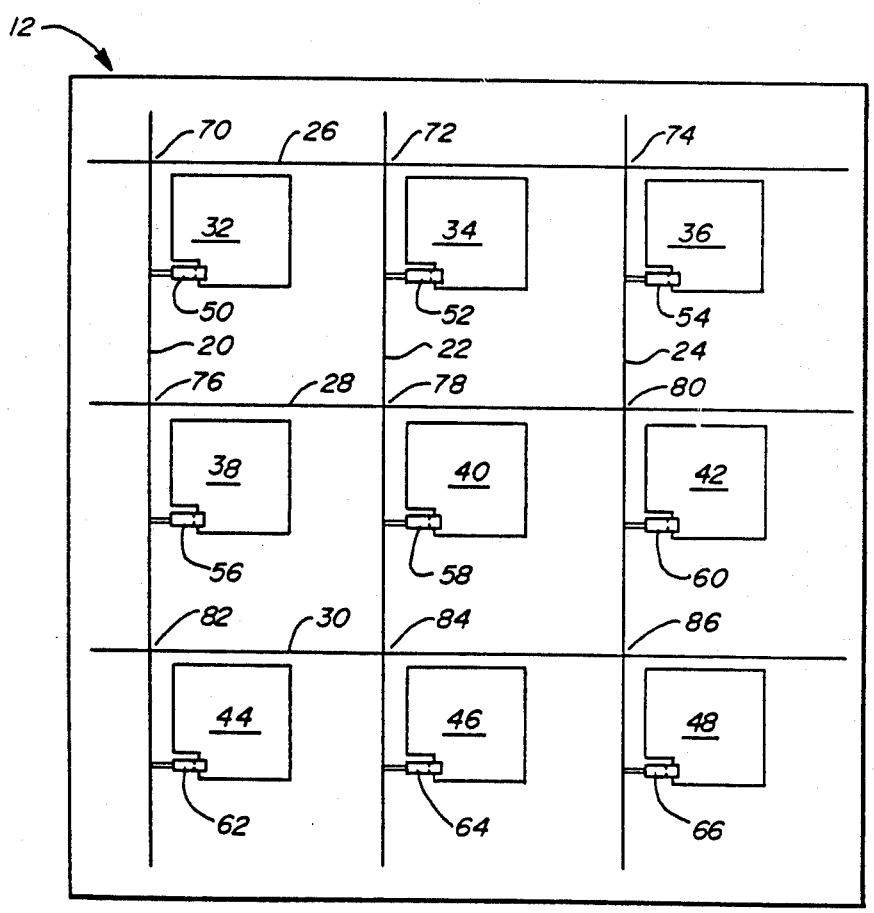
FIG. 2 is a top plan view of the contact-type scanner of FIG. 1 with the document removed.

FIGS. 1 and 2 illustrate a contact-type document scanner system, generally 10, and apparatus, generally 12, embodying the concepts disclosed by the present invention. The system 10 illustrated in FIG. 1 generally includes an apparatus 12 capable of providing electrical signals representative of an image carried by an image-bearing member such as a document 14 disposed thereover and a light source 16.

The apparatus 12 includes a transparent substrate 18, a first set of X address lines including address lines 20, 22 and 24, a second set of Y address lines including address lines 26, 28 and 30, and a plurality of light sensitive elements 32, 34, 36, 38, 40, 42, 44, 46 and 48. The apparatus 12 further includes an isolation device 50, 52, 54, 56, 58, 60, 62, 64 and 66 associated with each light sensitive element and a transparent, abrasion resistant cover layer 68.

As can be noted in FIG. 2, the X address lines 20, 22 and 24 and the Y address lines 26, 28, and 30 cross at an angle, and, as will become more apparent hereinafter, are spaced from one another to form a plurality of crossover points 70, 72, 74, 76, 78, 80, 82, 84 and 86. Associated with each of the crossover points is a respective one of the light sensitive elements. The light sensitive elements 32-48 are formed on the substrate 18 and are distributed thereover in spaced apart relation to form interstitial spaces 88 therebetween. The light sensitive elements 32-48 are further of the type which effects a detectable electrical characteristic in response to the receipt of light thereon. As will be more fully described hereinafter, the light sensitive elements 32-48 can comprise photovoltaic cells or photoresistors which effect a detectable change in electrical conductivity in response to the receipt of incident light thereon. The light sensitive elements are preferably formed from a deposited semiconductor alloy material, such as an amorphous semiconductor alloy material. Preferably, the amorphous semiconductor alloy material includes silicon and/or germanium and hydrogen and/or fluorine. Such alloys can be deposited by plasma-assisted chemical vapor deposition, i.e., glow discharge, as disclosed, for example, in U.S. Pat. No. 4,226,898 which issued on Oct. 7, 1980 in the names of Stanford R. Ovshinsky and Arun Madan for Amorphous Semiconductors Equivalent to Crystalline Semiconductors Produced By A Glow Discharge Process.

Each of the isolation devices 50-66 is associated with a respective one of the light sensitive elements 31-48. The isolation devices are also preferably formed from a deposited semiconductor alloy material, and most preferably, an amorphous semiconductor alloy material including silicon and/or germanium. The amorphous silicon and/or germanium alloy can also include hydrogen and/or fluorine and can be deposited by plasma-assisted chemical vapor deposition as disclosed in the aforementioned U.S. Pat. No. 4,226,898. As can be noted in FIG. 2, each of the isolation device 50-66 is preferably coupled in series relation with its associated light sensitive element 32-48 between respective pairs of the X address lines 20, 22 and 24 and the Y address lines 26, 28 and 30 (obviously, other known types of multiplexing schemes may also be employed without departing from the spirit or scope of the subject invention). As a result, the isolation devices 50-66 facilitate the selective addressing and detection of the electrical conductivity of each of the light sensitive elements by the application of read potentials to respective pairs of the X and Y address lines.

Referring now more particularly to FIG. 1, the light source 16 comprises a plurality of individual light sources 90, 92 and 94. Associated with each of the sources 90, 92 and 94 is a reflector 96, 98 and 100. The light sources 90, 92 and 94 and the reflectors 96, 98 and 100 are arranged to provide diffuse light as indicated by the arrows 102, which light is projected onto the apparatus 12 on the side of the substrate 18 opposite the light sensitive elements and the document 14 to be scanned. The document 14 is operatively disposed over the transparent cover layer 68 which includes a substantially planar document-receiving surface 104. The document 14 includes at least one image-bearing portion 106 of high optical density, hereinafter referred to as the dark image-bearing portion of the document, and at least one image-bearing portion 108 of low optical density, hereinafter referred to as the light image-bearing portion of the document. The cover layer 68 is preferably relatively thin so that the document 14 is closely spaced in juxtaposed relation to the light sensitive elements, such as, light sensitive elements 44, 46 and 48 illustrated in FIG. 1, for "proximity focusing" light from the image on document 14 onto associated ones of the light sensitive elements. The thickness of the cover layer 68 is chosen to provide a maximum useable signal consistent with a number of other variable parameters. These variable parameters include the angular distribution of the diffuse light intensity, the width of the light sensitive element and the spacing between adjacent ones of the light sensitive elements. While, in one embodiment, it is preferable that the thickness of the cover layer 68, the width of the light sensitive elements and the spacing between the light sensitive elements are all of a comparable dimension, in other preferred embodiments and depending upon the sensitivity of the light sensitive elements, the surface finish of the material from which image-bearing member is fabricated, the pressure with which the image-bearing member is urged against the cover layer and the strength of the light signal, it has been found that a wide range of relative dimensions may be employed. The key element which typifies this type of "proximity focusing" is a one-to-one relationship between the size of the small area portion of the image sensed by any given light sensitive element and the size of the element itself.

In one embodiment, the cover layer 68 may be affixed to the substrate 18 by a transparent adhesive 110. The adhesive 110 is preferably a material having an index of refraction which matches the index of refraction of the substrate 18 to that of the cover layer 68 so as to minimize the reflection from the surface boundaries bordered by the matching material.

In alternative embodiments, the cover layer 68 may be formed from a thin film of a transparent, abrasion-resistant material which is of less than 1 micron thickness, said film vacuum deposited directly atop the upper electrode of the light sensitive elements. In this embodiment, the cover layer 68 is formed of wide band gap silicon-nitrogen alloys, silicon oxygen alloys, or silicon carbon alloys. These materials are transparent, hard, abrasion-resistant coatings, the fabrication parameters of which in, for instance, glow discharge deposition systems are well known to routineers in the art.

In yet another, most preferred embodiment, the cover layer 68 may be formed from a relatively thin (5000 angstrom thick) film of diamond-like microcrystalline carbon which is prepared by the plasma glow discharge decomposition of a precursor carbon-containing gaseous reagent. Among some of the sources of carbon which may be employed in the practice of the instant invention are hydrocarbon gases such as methane, ethane, acetylene, and the vapors of organic liquids such as hexane and the like. Another group of carbon-containing compounds having utility are the halocarbons such as the various chlorine, fluorine, iodine and bromine compounds of carbon, which may or may not include hydrogen therein. Under the influence of an electrical field, a plasma may be developed from such a carbon containing gas. In the plasma, the precursor gases are decomposed and the carbon released, thereby depositing the carbon upon the upper electrode of the light sensitive elements in a generally tetrahedral configuration so as to form a hard, abrasion-resistant, transparent (approximately 4.5 eV band gap) diamond-like deposit.

The plasma may be created by subjecting a precursor gaseous atmosphere to a source of electrical energy such as a microwave energy source, a radiofrequency energy source, any other source of alternating current, or a DC source of energy. In addition to the carbon-containing species, the process gas may additionally include other components, such as hydrogen, halogens, or inert gases. These additional components function to dilute the carbon-containing precursor gas so as to facilitate optimum conditions for the growth of diamond-like films; further the components may function as energy transfer agents to assist in the decomposition of the carbon-containing gas or they may function to accelerate the kinetics of the plasma reactions, for example by reacting with or otherwise scavenging various species in the plasma so as to shift equilibrium conditions and thereby favor the deposition of such high quality diamond-like carbon films.

In a typical deposition procedure: the array of light sensitive elements, with the upper electrodes already deposited thereupon, is operatively positioned in an evacuable deposition chamber. The chamber is sealed and pumped down to a background pressure which is typically less than $10^{-2}$ to $10^{-3}$ Torr. A process gas mixture of approximately 50–100 SCCM of methane and 100–500 SCCM of hydrogen is then introduced into the deposition chamber. The pumping speed is adjusted so as to maintain a total chamber pressure of approximately 0.1 Torr therein while the process gas flows therethrough. The substrate is heated to a temperature of approximately 200°–300° C. and microwave energy of about 2.45 GHz, at a total power level of approximately 75–175 watts, is introduced into the deposition chamber so as to create an excited plasma from the process gas therein. A bias of approximately +80 volts is established by disposing a charged wire in the plasma region. The current flow through the bias wire is approximately 175 milliamps. Deposition conditions are maintained for approximately 20 minutes which results in the deposition of a transparent, carbon-based layer of approximately 7,500 angstroms thickness which exhibits no significant carbon-hydrogen signature in the infrared absorption spectrum thereof.

Numerous variations of this process are within the spirit and scope of the subject invention. While it is possible to increase the amount of hydrogen in the precursor gaseous mixture, if the dilution increases too drastically, the deposition of microcrystalline-carbon decreases. In other words, a delicate balance of etch-deposition conditions must be maintained in order to deposit microcrystalline, vis-a-vis, amorphous carbon, diamond-like material. It should be specifically noted that inert gases such as argon, xenon and helium may be substituted for some or all of the hydrogen.

Figure 8:
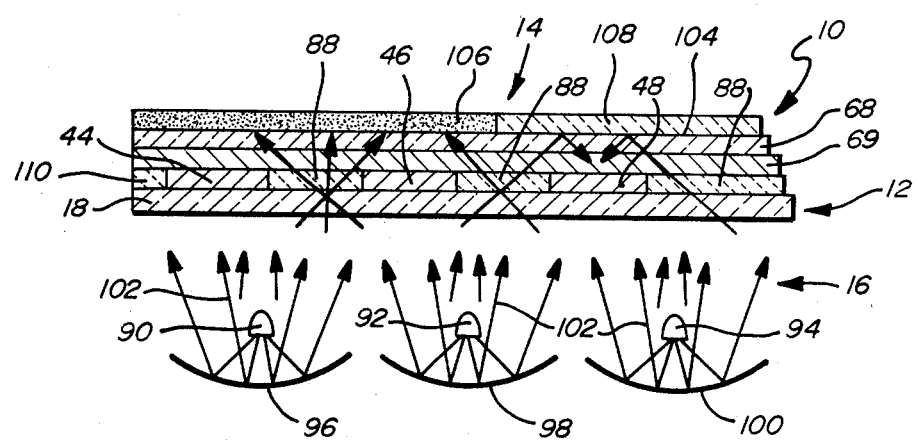
FIG. 8 is a partial side view, partly in cross section, of the scanner system of the present invention as illustrated in FIG. 1 with a static shielding layer added thereto.

Referring now to FIG. 8, the document scanning apparatus 12 of FIG. 1 is illustrated with the addition thereto of a static shielding layer generally referred to by the reference numeral 69. This shielding layer 69 was incorporated because the inventors discovered that a static electrical charge of up to 600 volts or more could build up on the image-bearing document 14. It is possible that such a large static charge could induce a charge of similar magnitude in the light sensitive elements disposed immediately therebelow, which induced charge is capable of destroying the diode characteristic of those elements. Therefore, a thin film conductive layer, preferably formed of oxides of indium, tin, indium-tin, cadmium, zirconium or zinc, may be vacuum deposited between the light sensitive elements and the cover layer 69. By connecting this shielding layer to ground potential (or to substantially the same potential as the light sensitive elements), the built-up static electrical charge on the image-bearing document 14 is unable to induce a similar charge in the light sensitive elements. As would be apparent to a routineer in the art, the thickness of the shielding layer 69 need only be sufficient to fully cover the light sensitive elements on which it is deposited, i.e., about 500–2500 angstroms. While the above referenced oxides constitute the preferred material from which to fabricate the shielding layer 69, other conductive, transparent coatings such as metals may be employed with equal advantage.

When the image-bearing document 14 is to be scanned, it is first placed over the apparatus 12 in substantial contact with the planar surface 104 of the transparent cover layer 68 or in contact with any other spacing or light columnating member so that the document is disposed in closely spaced juxtaposed relation to the light sensitive elements. Then, the light source 16 is energized for projecting the diffuse light 102 onto the back side of the apparatus 12 and then onto the surface of the document 14 adjacent the planar surface 104. In the dark portions 106 of the image on the document 14, the light will be substantially absorbed so that very little of the light impinging upon the dark portions 106 will be reflected back onto the associated light sensitive elements adjacent thereto, for example, light sensitive elements 44 and 46. However, the light striking the light portions 108 of the image on the document 14 will not be substantially absorbed and a substantially greater portion of the light impinging upon the light portions 108 will be reflected back onto the associated light sensitive elements adjacent thereto, such as light sensitive element 48. The light sensitive elements adjacent the light portions 108 of the document will thereby effect a detectable change in their electrical conductivity. When the light sensitive elements are formed from photovoltaic cells, they will not only effect a change in electrical conductivity, but will also generate current. When the light sensitive elements are photoresistors, they will effect an increased electrical conductivity which can be detected by the application of read potentials to the respective pairs of the X address lines 20, 22 and 24, and the Y address lines 26, 28 and 30.

Electrical signals representing a faithful reproduction of the image on the image-bearing document 14 can be obtained because the light sensitive elements can be made very small. For example, the light sensitive elements can be fabricated to have dimensions of approximately 90 microns on a side. The isolating devices 50–66 can be formed to have a dimension of about 10–40 microns on a side and preferably 20 microns on a side. Also, the light sensitive elements 32–48 can be spaced apart so that they cover only a portion of the substrate 12 to permit the light to be projected onto the document to be scanned through the interstices which exist therebetween. For example, the light sensitive elements can be spaced so that they cover about 25–50% of the overall surface area of the substrate 18. Also, the light sensitive elements can be arranged in substantially coplanar relation so that each will be equally spaced from the document to be scanned which is spacedly juxtaposed thereabove. Although FIG. 2 illustrates a 3×3 matrix of light sensitive elements, it can be appreciated that a much larger array of elements would be required in actual practice for scanning the entirety of an image-bearing document. Alternatively, the array of elements can be limited to a single elongated column or row; however, if the array is limited to a single 1×n or m×1 array, the array must be movable relative to the image-bearing document.

The electrical characteristic, and, in accordance with this preferred embodiment, the electrical conductivity of the light sensitive elements can be detected by applying read potentials to respective pairs of the X and Y address lines in series, and one at a time. However, and most preferably, the light sensitive elements can be divided into groups of elements and the read potentials can be applied to each group of elements in parallel to facilitate more rapid scanning of the document. Within each group of elements, the elements can be scanned in series.

Figure 3:
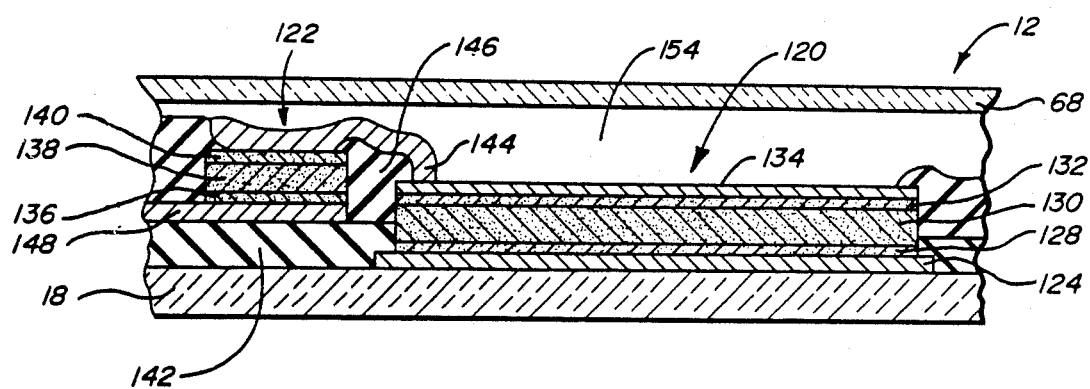
FIG. 3 is a partial cross-sectional side view illustrating a light sensitive element and an isolating device associated therewith embodying the present invention.
Figure 4:
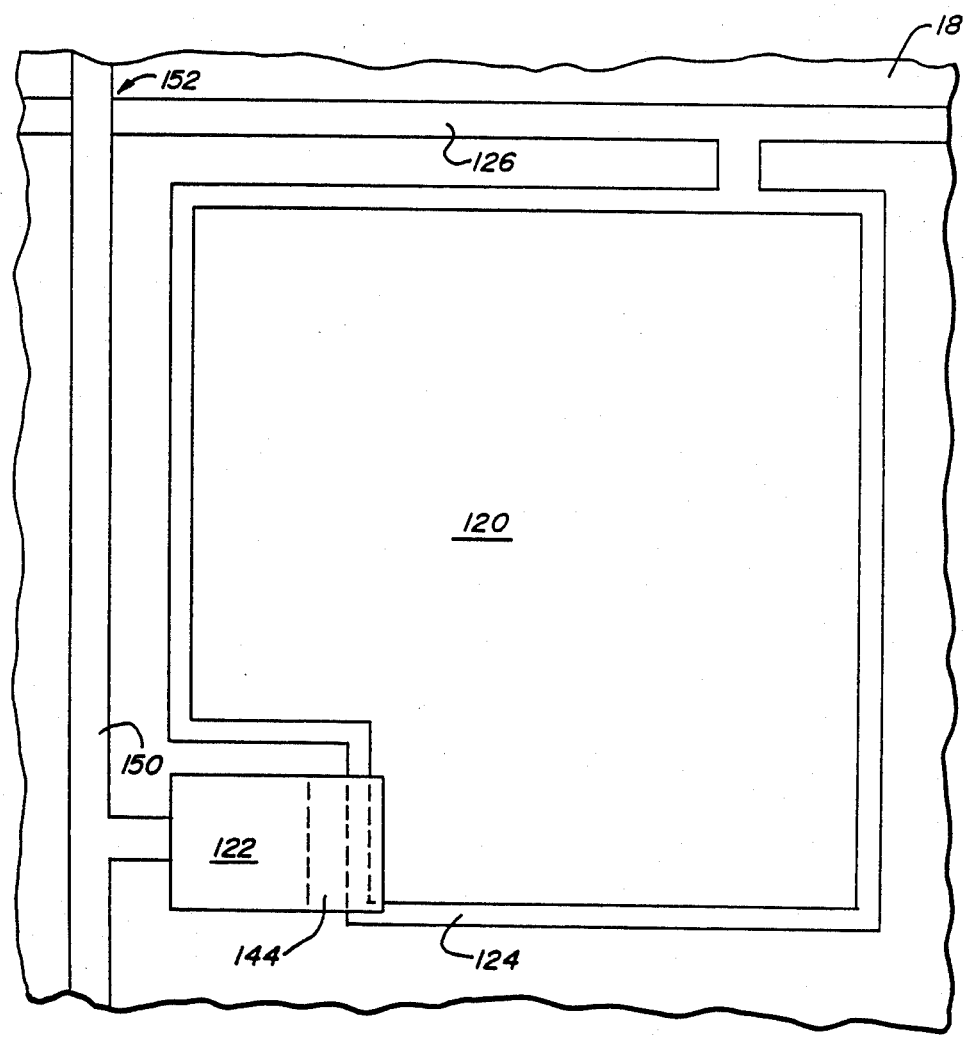
FIG. 4 is a top plan view of the light sensitive element and isolating device of FIG. 3.

Referring now to FIGS. 3 and 4, there is illustrated in greater detail a configuration of a light sensitive element 120 and an isolation device 122 structured in accordance with the principles of the present invention. Here, the apparatus 12 includes a transparent or glass substrate 18. Formed on the substrate 18 is a metal pad which is electrically connected to a Y address line 126. The metal pad 124 can be formed from aluminum, chromium, or molybdenum, for example.

Formed on the metal pad 124 is the light sensitive element 120 which can take the form of a photovoltaic cell. The photovoltaic cell or light sensitive element 120 can include an amorphous silicon or germanium alloy body having a first doped region 128, an intrinsic region 130 and a second doped region 132. The regions 128 and 132 are preferably opposite in conductivity so that the region 128 is p-type and the region 132 is n-type. Overlying the n-type region 132 is a layer 134 of a transparent conductive oxide material such as indium tin oxide. Photovoltaic cells of this type are fully disclosed, for example, in the aforementioned U.S. Pat. No. 4,226,898 and therefore need not be described in detail herein.

The metal pad 124 not only forms an ohmic contact with the light sensitive element 120, but in addition, serves to block light from reaching the back side of the light sensitive element. This function of the metal pad 124 is particularly important when the scanning system is to be used in accordance with the embodiment illustrated in FIG. 1.

The isolation device 122, fabricated in accordance with this embodiment, comprises a diode, also formed from an amorphous silicon or germanium alloy having a p-type region 136, an intrinsic region 138 and an n-type region 140. The diode 122 is also formed on a metal pad 148 which is formed on a layer of a deposited insulating material 142 which can be fabricated from, for example, silicon oxide or silicon nitride. Since the diode 122 and the cell 120 include the same layer composition and structure, said diode 122 can be formed during the same deposition operation as the photovoltaic cell 120.

The diode 122 is coupled to the photovoltaic cell 120 by an interconnect lead 144. Separating the diode 122 from the photovoltaic cell 120 is a deposited insulator 146 which can also be formed from silicon oxide or silicon nitride.

The metal pad 148 is coupled to an X address line 150. As can be noted in FIG. 3, the X address line 150 and the Y address line 126 are spaced apart by the insulating layer 142. Because the address lines cross at an angle and are separated from one another, an insulated crossover point 152 is thereby formed.

The structure of FIG. 3 is completed by the superposed positioning of a transparent cover layer 68 (which can be formed from glass or the hard thin films described hereinabove) over the diode and the light sensitive element, said layer vacuum deposited thereupon or adhered thereto by a transparent adhesive which can fill the space 154. As previously mentioned, the transparent adhesive preferably has an index of refraction (1.45–1.57) which matches the index of refraction of the glass substrate 18 to that of the cover layer 68 so as to provide for the maximum transmission of light from the glass substrate through the layer.

Figure 5:
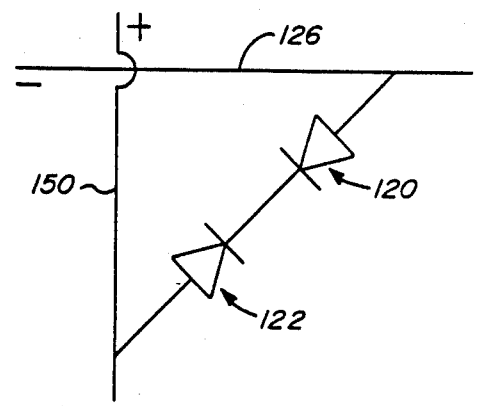
FIG. 5 is an equivalent circuit diagram of the light sensitive element and isolating device of FIG. 3.

Referring now to FIG. 5, there is illustrated the equivalent circuit diagram of the light sensitive element 120, the isolating diode 122 and the address lines 126 and 150 described with reference to FIG. 4. It can be noted that the interconnect lead 144 connects the cathodes of the photovoltaic cell 120 and diode 122 together. The anode of the diode 122 is coupled to the X address line 150 and the anode of the photovoltaic cell 120 is coupled to the Y address line 126.

In order to read the electrical characteristic of the photovoltaic cell 120, a positive potential is applied to the X address line 150 and a negative potential is applied to the Y address line 126. This forward biases the isolating diode 122. If light is being reflected off of a light small area portion of the image on the image-bearing document onto the associated small area photovoltaic cell 120, a photogenerated current will be produced within the cell 120 and will be detected through the forward biased diode 122. However, if the small area cell 120 is disposed adjacent to and therefore associated with one of the dark small portions of the image-bearing document, substantially no light strikes the cell and hence substantially no photogenerated current will be produced by the cell 120. The difference between the two current levels can therefore be contrasted for deriving an electrical signal representative of the image adjacent the cell 120.

Figure 6:
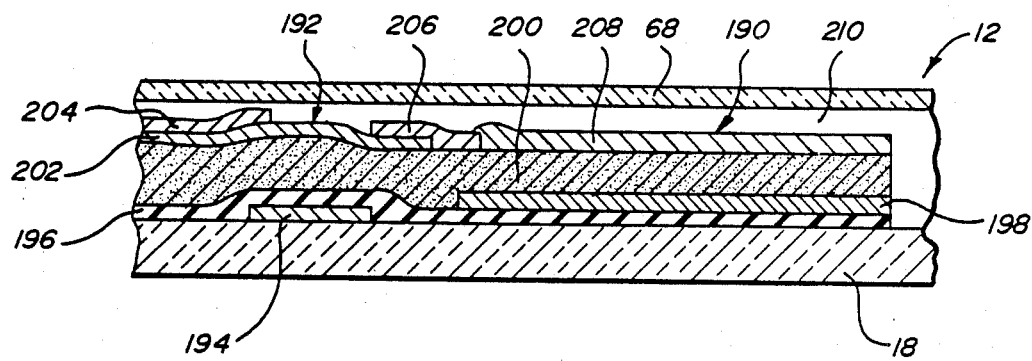
FIG. 6 is a partial cross-sectional side view of another light sensitive element and isolating device structured in accordance with a further embodiment of the present invention.

Referring now to FIG. 6, there is illustrated a further configuration of the light sensitive element 190 and the isolation device 192. Here, the light sensitive element 190 takes the form of a photoresistor and the isolating device 192 takes the form of a thin film field effect transistor. The apparatus 12 illustrated in FIG. 8 includes a transparent substrate 18, which can be formed from glass, for example. The gate of the thin film field effect transistor 192 is first formed on the substrate 18. A layer of insulating material 196 is then deposited over the gate 194 and the substrate 18. A metallic pad 198 is then formed over the insulator 196 to define one contact of the light sensitive element or photoresistor 190.

A substantially intrinsic amorphous silicon alloy layer 200 is then deposited as shown for forming the semiconductor body of the thin film field effect transistor 192 and the semiconductor body of the photoresistor 190. A layer 202 of n-type amorphous silicon can then be formed over the intrinsic amorphous silicon alloy 200 to enhance the ohmic contact between the source and drain electrodes 204 and 206 with the amorphous silicon alloy 200. A layer of a transparent conductor 208 can be formed over the amorphous silicon alloy 200 in contact with the transistor electrode 26 and in a corresponding configuration to the metal pad 198 to define the top contact of the photoresistor 190. The structure of FIG. 6 is completed with the transparent cover layer 68, which can be formed from glass or one of the other hard, transparent coatings detailed hereinabove, and a transparent adhesive, if necessary, filling the space 210 as previously described.

Figure 7:
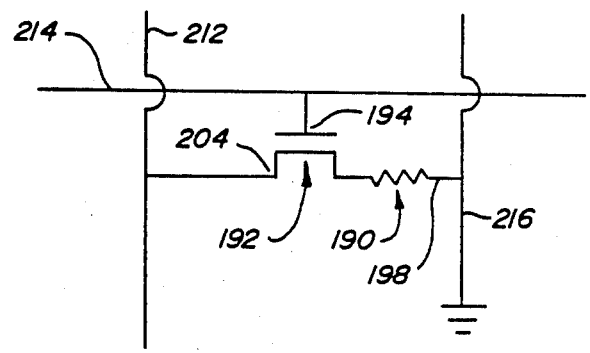
FIG. 7 is the equivalent circuit diagram of the light sensitive element and isolating device of FIG. 6.

As will be noted in FIG. 6, the gate 194, the electrode 204, and the bottom contact 198 of the photoresistor 190 are all vertically separated from one another. As a result, each of these elements can be connected to respective address lines while being insulated from one another. FIG. 7 shows the equivalent circuit diagram of the structure illustrated and described with reference to FIG. 6.

In FIG. 7, it can be noted that the electrode 204 of the thin film field effect transistor 192 is coupled to an X address line 212. The gate 194 of the transistor 192 is coupled to a Y address line 214. The bottom contact 198 of the photoresistor 190 is coupled to a common potential such as ground by a lead 216. As a result, the electrical conductivity of the photoresistor 190 can be sensed by the application of suitable potentials to the electrode 204 and gate 194 for turning the transistor 192 on. If light is being reflected off of a light portion of the image on an image-bearing document onto the photoresistor 190, a current will flow between the transistor electrodes 204 and 206 which can be sensed on the X address lead 212. However, if the photoresistor 190 is immediately adjacent a dark portion of the image on the image-bearing document, very little light will be projected onto the photoresistor 190 so that substantially no current will flow from the electrode 204 to the electrode 206. In this manner, the condition of the photoresistor 190 can be detected.

In accordance with the present invention, electrical signals can be provided which represent the color hues of an image. For example, each of the light sources 96, 98 and 100 can include three separate light sources, each being arranged to emit light of each different primary color, i.e., red, green, and blue. To generate the electrical signals representative of the color hues of the image, the image-bearing member 14 can be sequentially exposed to the red, green and blue light. During each exposure, the associated light sensitive elements can be addressed. For example, when the document 14 is exposed to the red light, those image portions thereof which include a red color component will reflect red light onto the light sensitive elements adjacent thereto. These elements will effect a greater change in electrical conductivity than those elements adjacent image portions which do not include a red color component. After this procedure is performed for each of the red, green and blue primary colors, the three electrical signals provided from each light sensitive element can be combined to derive both the intensity and color hue of the image.

From the foregoing, it can be appreciated that the present invention provides a new and improved apparatus for providing electrical signals representative of an image projected thereon. As can also be appreciated from the foregoing, the light sensitive elements can be formed from photovoltaic cells or photoresistors which exhibit a detectable change in an electrical characteristic such as electrical conductivity upon receipt of incident light thereupon. The isolating devices can take the form of diodes or thin film field effect transistors, for example, and any combination of such light sensitive elements and isolating devices are possible.

The apparatus of the present invention exhibits distinct advantages over similar apparatus of the prior art. Also, the image-bearing document can be electrically read at a faster rate than that possible with prior art scanners, especially when the light sensitive elements are read in parallel. Also, the document scanners of the present invention can be made substantially smaller and lighter to enhance the portability thereof. Further, static charges will not build up on the document-receiving surfaces of the apparatus and said transparent, document-receiving surface can be fabricated so as to be extremely hard and abrasion resistant, thereby increasing the lifetime of the apparatus.

While for purposes of illustration and explantion, several forms of this invention have been disclosed, other forms thereof may become apparent to those skilled in the art upon reference to this disclosure and, therefore, this invention is to be limited only by the scope of the appended claims.

We claim:

1. Apparatus capable of providing electrical signals representative of an image on an image-bearing member, said apparatus including a photosensitive array of deposited semiconductor light sensitive elements, each of said elements being non-light transmissive, non-apertured, continuous and adapted to receive light from a corresponding small area portion of said image-bearing member and generate a detectable signal representative of the intensity of received light; the improvement comprising, in combination:

said array including at least one column of light sensitive elements operatively disposed so as to cover at least a portion of at least one dimension of said image-bearing member; and spacing means for closely positioning said light sensitive elements in juxtaposed relation relative to said image-bearing member so as to proximity focus light onto said light sensitive elements from corresponding small area portions of said member, said spacing means including a transparent cover layer overlying said light sensitive elements; said cover layer formed of a material selected from the group consisting essentially of a silicon-carbon alloy, a silicon-nitride alloy, a silicon-oxygen alloy or microcrystalline carbon.

2. Apparatus as in claim 1 wherein the light sensitive elements are fabricated from a deposited semiconductor alloy material selected from the group consisting essentially of a silicon alloy, a germanium alloy, or combinations thereof.

3. Apparatus as in claim 1 wherein said light sensitive elements comprise P-I-N photovoltaic cells.

4. Apparatus as in claim 1 wherein said light sensitive elements comprise P-I-N photoresistors.

5. Apparatus as in claim 1 wherein said deposited semiconductor is amorphous.

6. Apparatus as in claim 5 wherein said amorphous semiconductor includes at least one density of states reducing element selected from the group consisting essentially of hydrogen and fluorine.

7. Apparatus as in claim 3 wherein said photovoltaic cells include a first doped region, a substantially intrinsic region and a second doped region of opposite conductivity from that of said first doped region.

8. Apparatus as in claim 1 further including isolation means associated with each of said light sensitive elements for facilitating the selective addressing of said elements.

9. Apparatus as in claim 8 wherein each of said isolation means comprise diodes.

10. Apparatus as in claim 8 wherein said diodes include a first doped region, a substantially intrinsic region, and a second doped region of opposite conductivity from that of said first doped region.

11. Apparatus as in claim 8 wherein said isolation devices comprise thin film transistors.

12. Apparatus as in claim 11 wherein said thin film transistors are field effect transistors.

13. Apparatus as in claim 12 wherein said light sensitive elements are coupled to a common potential.

14. Apparatus as in claim 1 wherein said light sensitive elements are disposed in a substantially common plane.

15. Apparatus as in claim 1 further including means for projecting light onto said image-bearing member, said light projecting means operatively disposed on the side of the image-bearing member closest to said spacing means.

16. Apparatus as in claim 15 wherein said light means is adapted to project diffuse light.

17. Apparatus as in claim 16 wherein said light means is adapted to sequentially project light of different colors onto said image-bearing member.

18. Apparatus as in claim 17 wherein said light means is adapted to sequentially project red, green, and blue light.

19. Apparatus as in claim 8 wherein each isolation means comprises a diode; and each of said light sensitive elements and the associated diode includes a semiconductor body formed of stacked thin film layers including a first doped layer of a first conductivity type, a substantially intrinsic layer, and a second doped layer of a conductivity type opposite to that of said first doped layer.

20. Apparatus as in claim 19 further comprising a substrate over which said light sensitive elements and said isolation diodes are formed and wherein the order of said stacked thin layers from which the semiconductor body of each light sensitive element and isolation diode is fabricated is the same.

21. Apparatus as in claim 20 wherein each of the light sensitive elements further includes first and second electrodes.

22. Apparatus as in claim 21 wherein the first electrodes of said light sensitive elements are each formed upon said substrate as a distinct, substantially opaque, thin film, conductive pad and the semiconductor bodies of each light sensitive element and the associated isolation diode thereof are formed upon and electrically interconnected by said opaque conductive pad.

23. Apparatus as in claim 22 wherein said substrate is transparent and the opaque conductive pads of said light sensitive elements are operatively disposed in spaced relation to one another to permit light passing through said substrate and between and around said conductive pads to illuminate said image-bearing member.

24. Apparatus as in claim 1 further including static shielding means for eliminating the build-up of a large static charge on the transparent cover layer.

25. Apparatus as in claim 24 wherein said shielding means is fabricated from a material selected from the group consisting of an oxide of indium, tin, zinc, zirconium, cadmium, or mixtures thereof.

26. Apparatus as in claim 25 wherein said shielding means is fabricated from a material selected from the group consisting of gold, silver, aluminum, copper or other highly conductive metal.

* * * * *